US012610577B2

(12) United States Patent
Baringhaus et al.

(10) Patent No.: US 12,610,577 B2
(45) Date of Patent: Apr. 21, 2026

(54) VERTICAL FIELD-EFFECT TRANSISTOR AND METHOD FOR ITS FORMATION

(71) Applicant: Robert Bosch GmbH, Stuttgart (DE)

(72) Inventors: Jens Baringhaus, Sindelfingen (DE); Joachim Rudhard, Leinfelden-Echterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 482 days.

(21) Appl. No.: 17/775,924

(22) PCT Filed: Nov. 5, 2020

(86) PCT No.: PCT/EP2020/081091
§ 371 (c)(1),
(2) Date: May 11, 2022

(87) PCT Pub. No.: WO2021/110349
PCT Pub. Date: Jun. 10, 2021

(65) Prior Publication Data
US 2022/0384634 A1 Dec. 1, 2022

(30) Foreign Application Priority Data
Dec. 3, 2019 (DE) ..................... 10 2019 218 731.5

(51) Int. Cl.
*H10D 30/62* (2025.01)
*H10D 30/01* (2025.01)
*H10D 30/63* (2025.01)

(52) U.S. Cl.
CPC ......... *H10D 30/62* (2025.01); *H10D 30/0245* (2025.01); *H10D 30/63* (2025.01)

(58) Field of Classification Search
CPC ............. H01L 29/785; H01L 29/66818; H01L 29/7827; H01L 29/4991; H01L 29/66666; H01L 29/42376; H01L 29/7828; H10D 30/62; H10D 30/0245; H10D 30/63;
(Continued)

(56) References Cited

U.S. PATENT DOCUMENTS 9,728,466 B1 8/2017 Mallela et al.
2005/0186742 A1* 8/2005 Oh ..................... H10D 30/6713
438/283
2006/0091453 A1 5/2006 Matsuda et al.
(Continued)

FOREIGN PATENT DOCUMENTS

EP 1130634 A1 * 9/2001 ........ H01L 21/28211
EP 2975648 A1 1/2016
(Continued)

OTHER PUBLICATIONS

International Search Report for PCT/EP2020/081091, Issued Feb. 15, 2021.

*Primary Examiner* — Sitaramarao S Yechuri
(74) *Attorney, Agent, or Firm* — NORTON ROSE FULBRIGHT US LLP

(57) ABSTRACT

A vertical field-effect transistor. The vertical field-effect transistor includes: a drift region, a semiconductor fin on or above the drift region, and a source/drain electrode on or above the semiconductor fin. The semiconductor fin includes at least one concave side wall in the region between the drift region and the source/drain electrode.

10 Claims, 8 Drawing Sheets

(58) Field of Classification Search
CPC .. H10D 30/025; H10D 30/635; H10D 64/679;
H10D 64/518
See application file for complete search history.

(56)                     References Cited

U.S. PATENT DOCUMENTS

| | | | |
|---|---|---|---|
| 2010/0163939 | A1 | 7/2010 | Kronholz et al. |
| 2010/0289081 | A1 | 11/2010 | Griebenow |
| 2014/0322882 | A1 | 10/2014 | Rodder et al. |
| 2015/0048413 | A1 | 2/2015 | Arakawa et al. |
| 2015/0268189 | A1* | 9/2015 | Rigante .............. H10D 30/6211 |
| | | | 257/253 |
| 2016/0268399 | A1 | 9/2016 | Akarvardar et al. |
| 2021/0028312 | A1* | 1/2021 | Drowley .............. H10D 64/602 |

FOREIGN PATENT DOCUMENTS

| | | |
|---|---|---|
| KR | 20080011491 A | 2/2008 |
| WO | 2007002857 A2 | 1/2007 |

* cited by examiner

Fig. 1A
Related Art
Fig. 1B
Related Art
Fig. 1C
Related Art
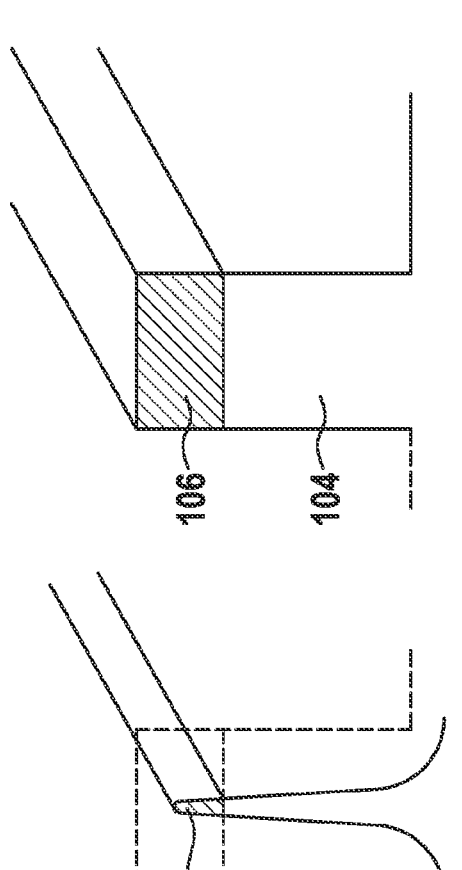
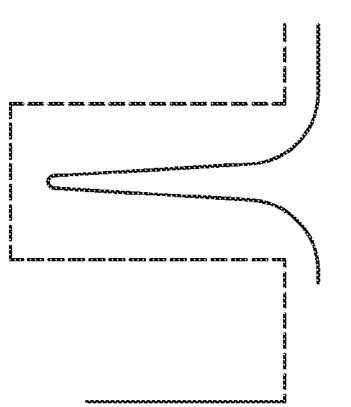

VERTICAL FIELD-EFFECT TRANSISTOR AND METHOD FOR ITS FORMATION

FIELD

The present invention relates to a vertical field-effect transistor, and to a method for its formation.

BACKGROUND INFORMATION

In the automotive sector, as development is increasingly in the direction of electric mobility, solutions are sought for power semiconductors that provide rapid switching without losses. The simultaneous trend away from lateral and toward vertical components, and the trend in silicon technology, a field which has been established for decades, toward so-called "wide-bandgap" materials—semiconductor materials such as silicon carbide (SiC) or gallium nitride (GaN)—in this context has resulted in the development of new component concepts and manufacturing processes.

The increasing integration density of semiconductor structures makes it possible to utilize the entire rear surface of components, using vertical concepts. In the case of certain concepts that exploit band bending, for example the finFET (fin field-effect transistor), the use of established process sequences means that the small contact surface of semiconductor fins becomes a problem for the creation of sufficiently low-resistance contact in power semiconductors. The functional principle of the finFET requires very thin, free-standing structures in which current is guided vertically (semiconductor fins). As a result, the semiconductor fins do not have a large surface for contact on the front side. The high integration density in the case of vertical semiconductor components may result in an extremely small source contact surface on the front side. FIGS. 1A-1C show schematic views of a semiconductor fin of a conventional finFET. FIG. 1A shows a cross-sectional profile, FIG. 1B a perspective view, and FIG. 1C a conceptual view of a semiconductor fin of a finFET. In this case, a front-side contact, for example a terminal region 106 with n+ doping for a source contact, is formed on a semiconductor fin 104 on a drift region 102. The semiconductor fins have, throughout, a narrow shape rounded at the ends. Some of terminal region 106 is removed at the time of manufacture, producing rounded, needle-shaped structures that extend laterally into the plane and have to make contact with the source electrode at their pointed top end.

FIG. 1A shows, in section, the shape after the fin structures have been produced, by comparison with the initial grid shape (shown in dashed lines; see FIG. 1C). The n+-doped terminal region 106 that has been removed can be maintained as a result of the implantation depth. However, the loss of reliable contact surface (indicated depth-wise in three dimensions in FIG. 1B) represents an undesirable disadvantage.

SUMMARY

It is an object of the present invention to provide a vertical field-effect transistor, and a method for its formation, that make possible a vertical field-effect transistor with improved front-side contact.

According to a first aspect of the present invention, the object may be achieved by a vertical field-effect transistor. In accordance with an example embodiment of the present invention, the vertical field-effect transistor includes: a drift region, a semiconductor fin on or above the drift region, and a source/drain electrode on or above the semiconductor fin, the semiconductor fin including at least one concave side wall in the region between the drift region and the source/drain electrode. The concave side wall of the semiconductor fin makes a larger contact surface possible on the semiconductor fin. This makes possible a smaller contact resistance, for example of the source contact, on the semiconductor fin.

According to a further aspect of the present invention, the object may be achieved by a method for forming a vertical field-effect transistor. In accordance with an example embodiment of the present invention, the method includes: forming a drift region, forming a semiconductor fin on or above the drift region, and forming a source/drain electrode on or above the semiconductor fin, the semiconductor fin being formed with at least one concave side wall in the region between the drift region and the source/drain electrode.

Further developments of the aspects are disclosed herein. Specific embodiments of the present invention are presented in the figures and explained in more detail below.

BRIEF DESCRIPTION OF THE DRAWINGS

FIGS. 1A-1C show schematic illustrations of conventional semiconductor fins.

FIGS. 3-14 each show a schematic illustration of a method step for manufacturing a vertical field-effect transistor according to various example embodiments of the present invention.

DETAILED DESCRIPTION OF EXAMPLE EMBODIMENTS

Figure 2:
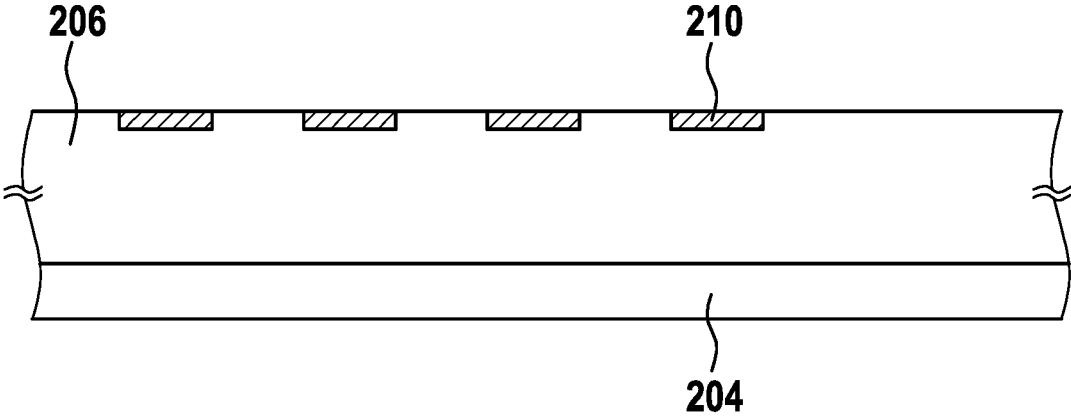
FIG. 2 shows a schematic sectional illustration of a vertical field-effect transistor according to various example embodiments of the present invention.

In the detailed description below, reference is made to the figures, which form part of this description and in which specific exemplary embodiments in which the present invention can be put into practice are shown for the purpose of illustration. It will be understood that other exemplary embodiments may be used, and that structural or logical amendments may be made without departing from the scope of protection of the present invention. It will be understood that the features of the various exemplary embodiments described here can be combined with one another provided there is no statement specifically to the contrary. Thus, the detailed description below should not be interpreted in a restrictive sense. In the figures, identical or similar elements are provided with identical reference characters where this is expedient.

FIG. 2 shows a schematic sectional illustration of a vertical field-effect transistor 200 according to various embodiments. In various embodiments, vertical field-effect transistor 200 includes a drift region 206 on a semiconductor substrate 204, a semiconductor fin 208 (the longitudinal direction of which extends perpendicularly to the plane of the drawing) with a terminal region 210 on or above drift region 206, a first source/drain electrode (such as a source electrode 218), and a second source/drain electrode (such as a drain electrode 202).

In the text below, it will be assumed, for the purpose of example, that first source/drain electrode 218 is a source electrode and that second source/drain electrode 202 is a drain electrode. Furthermore, vertical field-effect transistor 200 has a gate electrode 214 laterally next to at least one side wall of semiconductor fin 208, gate electrode 214 being electrically insulated from source electrode 218 with the aid of an insulation 216. A gate dielectric 212 is arranged between gate electrode 214 and at least one side wall of semiconductor fin 208.

Figure 14:
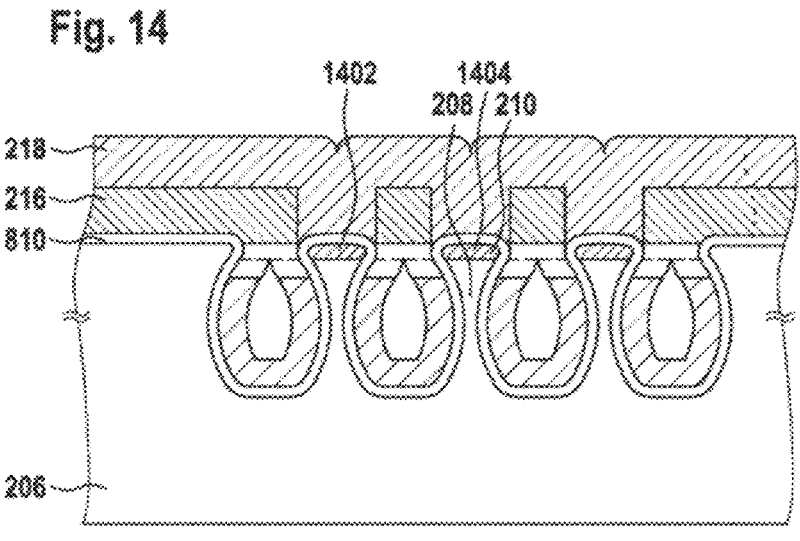

Semiconductor fin 208 includes at least one concave side wall in the region between drift region 206 and source/drain electrode 218 (not illustrated in FIG. 2; see FIG. 14). Semiconductor fin 208 may include a first side wall and a second side wall, which is on the opposite side to the first side wall. The first side wall and the second side wall may be concave in form. Furthermore, gate electrode 214 may be formed next to at least one concave side wall of semiconductor fin 208. The concave side wall may be formed in that semiconductor fin 208 has a smaller lateral extent in a first portion, which is arranged laterally next to gate electrode 214, than in a second portion, which makes contact with drift region 206, and/or than in a third portion, which makes contact with source electrode 218. This enables current-carrying contact surfaces on the substrate front side to be made larger by a multiple. As a result, a significantly lower and more reliable ohmic contact region for the vertical field-effect transistor can be made.

FIG. 2 shows a schematic sectional view through a single finFET cell according to various embodiments. Generally speaking, many hundred to thousands of such cells are connected in parallel, and the structure continues in a third dimension, into the drawing plane. Combining a plurality of cells produces a field of finFET cells that extends in two dimensions. The vertical field-effect transistor may be a power semiconductor component. As an example, semiconductor substrate 204 may be a GaN substrate 204 or a SiC substrate 204. Formed (for example, mounted) on semiconductor substrate 204 there may be a weakly n-conductive semiconductor drift region 206, for example a GaN drift region 206 or a SiC drift region 206. Formed above drift region 206 there may be an n-conductive semiconductor field in the form of semiconductor fin 208, for example in the form of a GaN or SiC fin 208.

For operation of vertical field-effect transistor 200 as a transistor or switch, semiconductor fin 208 has for example a lateral extent in the plane of the drawing, as illustrated, in the range of from approximately 100 nm to approximately 200 nm, and a vertical extent in the plane of the drawing as illustrated in the range of from approximately 1 µm to approximately 3 µm.

By applying a positive voltage across gate electrode 214, all the electron gas may be filled with electrons, and the electrons may flow from source electrode 218, through semiconductor fin 208 and into the base of semiconductor fin 208, and from there through drift region 206 and substrate 204 to reach drain electrode 202.

Semiconductor fin 208 may be formed for example by dugout structures to left and right of the semiconductor fin, also designated a deep trench, in a predetermined grid, for example a grid that is as small as possible. In various embodiments, the method includes the formation of a trench structure, for example with the aid of a dry etching process, in order to form a semiconductor fin of a first width. Furthermore, the method may include oxidation and removal of the semiconductor oxide that is formed by the oxidation, in order to form a semiconductor fin of a second width smaller than the first width. This has the effect of reducing the lateral structural extent of semiconductor fin

208. The process of oxidation and removal of the newly formed oxide may be repeated over a plurality of successive cycles.

Figure 4:
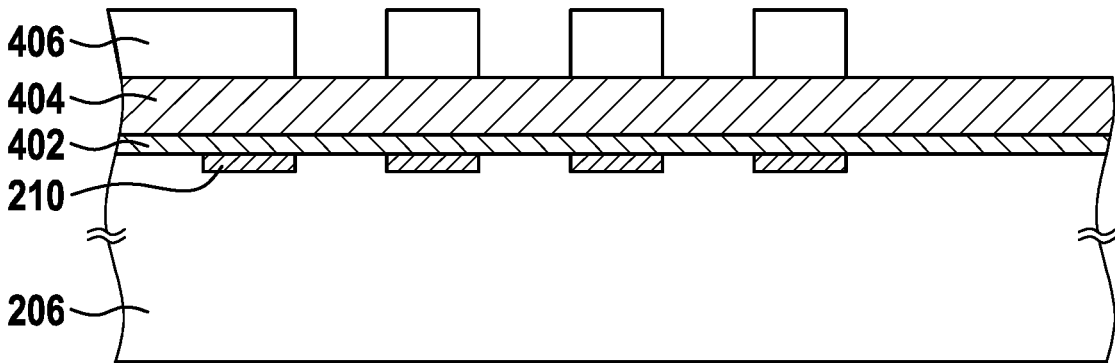

FIG. 3 illustrates drift region 206 on substrate 204 and n+-doped terminal regions 210, which have been formed by (ion) implantation in drift region 206. Onto the layer stack which is illustrated in FIG. 3, it is possible to deposit successively a layer stack having a first inorganic layer 402, for example silicon nitride layer 402, and a second inorganic layer 404, for example silicon oxide layer 404, as illustrated in FIG. 4. The layer thicknesses for the first and second inorganic layer 402, 404 are selected depending on the desired structuring depth of drift region 206, or the vertical extent of semiconductor fin 208 (see FIG. 5), and oxidation times to be expected during the "finforming" process. First inorganic layer 402 takes the form of an etch-stop layer for subsequent processes.

Taking the example of SiC as the semiconductor material for drift region 206, a silicon nitride layer 402 has a thickness in the range of from approximately 100 nm to approximately 1 µm, and a silicon oxide layer 404 has a thickness in the range of from approximately 800 nm to approximately 1,500 nm. The combination of layer thicknesses of silicon nitride and silicon oxide may be selected such that the silicon oxide of silicon oxide layer 404 is completely consumed during the process of structuring drift region 206. As an alternative, it is also possible to completely dispense with second inorganic layer 404 of silicon oxide, since silicon nitride layer 402 is itself sufficient for propagation of the process flow. The layer stack comprising the first and second inorganic layer 402, 404 may serve as a mask during structuring of the semiconductor material of drift region 206, and is accordingly produced before the structuring, with the aid of a suitable lithographic and structuring process. Arranged on second inorganic layer 404 is an exposed and developed photoresist 406. Photoresist 406 has openings below which the trench structures of adjacent semiconductor fins are subsequently formed.

Figure 5:
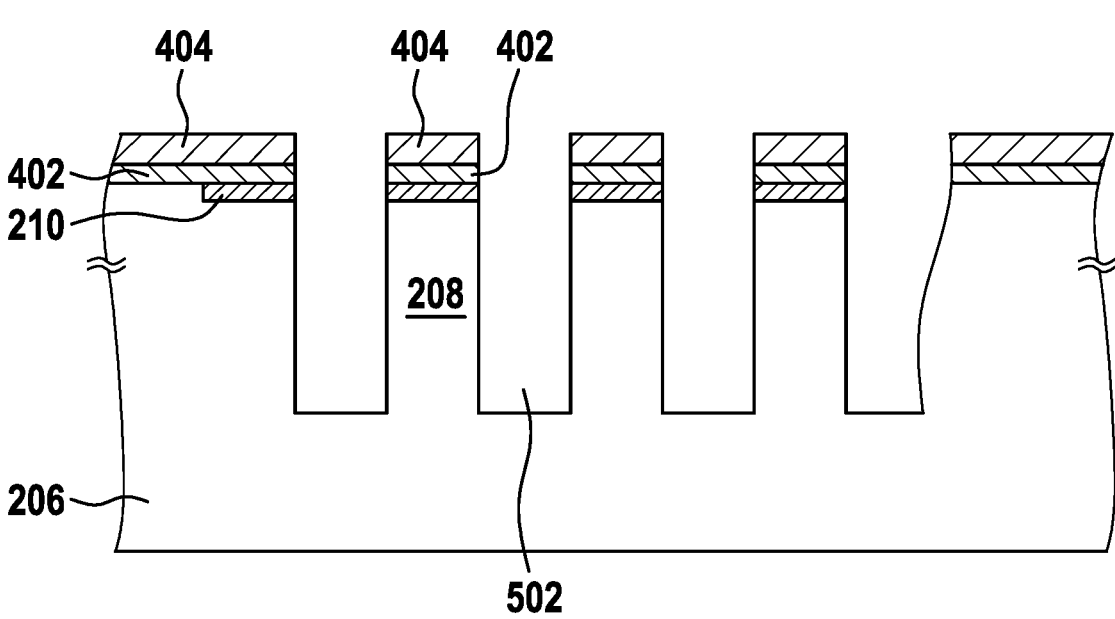

FIG. 5 illustrates structuring 208/502 of drift region 206, which is completed with the aid of silicon oxide-silicon nitride mask 404/402 (designated the oxide-nitride mask below). In this case, photoresist 406 was consumed, or residues of it removed, after structuring of oxide-nitride mask 404/402. The thickness of silicon oxide layer 404 was reduced in some places as trench structures 502 were produced. A residue of silicon oxide layer 404 may remain on silicon nitride layer 402. The residue of silicon oxide layer 404 may then be removed by wet chemistry, silicon nitride layer 402 acting as an etch-stop mask. Then, the lateral extent (in the drawing plane that is illustrated) of semiconductor fin 208 may be reduced by one or more cyclically repeated processes, as illustrated in FIG. 6.

Figure 6:
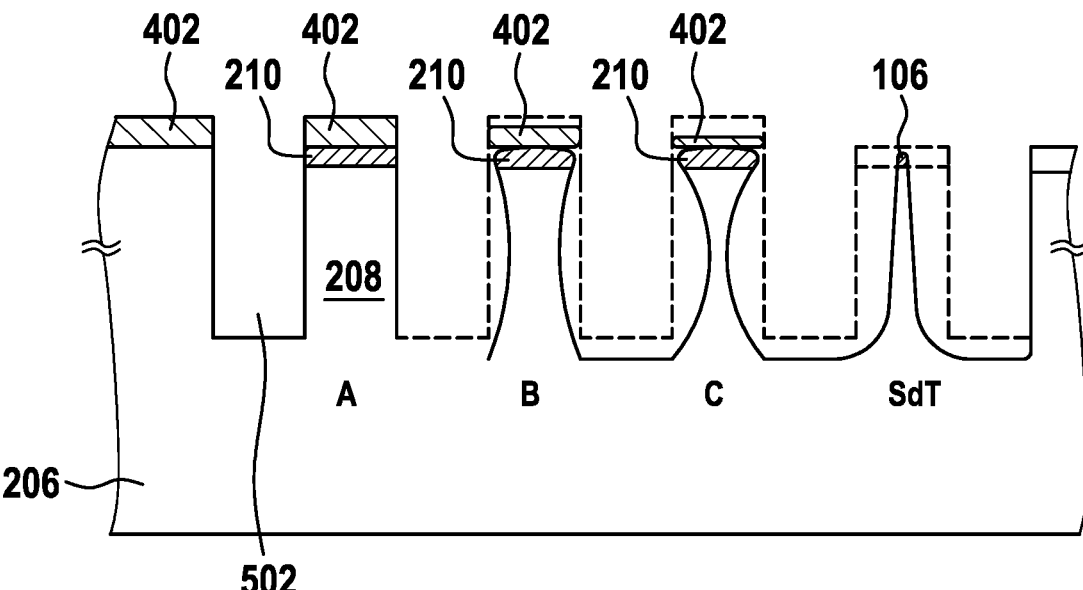

FIG. 6 is divided into 4 regions ("A, "B", "C", and "SdT"). Region A shows the initial condition before finforming (FIG. 5). Regions B and C show the condition after different amounts of progress in reducing the lateral extent of the semiconductor fin, the process of C having been progressed further than B. Semiconductor fins 208 that are illustrated in regions B and C may be formed by once (region B) or repeatedly (region C) removing semiconductor material from the side walls of semiconductor fin 208 (region A). As a result, at least one concave side wall of semiconductor fin 208 may be formed. The dashed line in regions B and C and in region SdT shows schematically the outline of the semiconductor fin before it undergoes lateral thinning (as in region A). The semiconductor fin that is illustrated on the far right in FIG. 6 (region SdT) shows a conventional semiconductor fin of the prior art, for the purpose of comparison. The lateral extent of semiconductor fin 208 (in FIG. 6, from region A→region B or region C) may be reduced to a predetermined thickness with the aid of oxidation of the semiconductor material of the semiconductor fin and removal of the semiconductor oxide that is formed. For example, the lateral extent may undergo thinning from approximately 500 nm to a value that may be set within a range of from 100 nm to approximately 200 nm. With the aid of the lateral extent of semiconductor fin 208, the threshold voltage of vertical field-effect transistor 200 may be set to a predetermined value specific to an application.

Region A in FIG. 6 shows structured trench 502 of drift region 206 and fin 208, with n+-doped terminal region 210 and first inorganic layer 402, which subsequently serves as an etch-stop mask, for example before a first oxidation and/or an etching. Re-oxidized silicon nitride (silicon oxynitride) may likewise be removed in the etching medium, which contains hydrofluoric acid. For this reason, for the oxidation of the semiconductor material, in particular in the case of silicon carbide, in respect of the oxidation behavior of the semiconductor material and the material of the etch-stop mask, an optimum mask consumption and oxidation of semiconductor material should be selected. The layer thickness of first inorganic layer 402 can thus be set to the optimum, depending on the number of cycles and the oxidation parameters (temperature, time, wet or dry oxidation). For oxidation of the semiconductor material of the semiconductor fin, it is possible to use a commercially available oxidation oven, widely used in the semiconductor industry.

In region B of FIG. 6, the change in shape after the process has progressed is shown by comparison with the initial shape (indicated by dashed lines). Concave side walls of semiconductor fin 208 are already visible, as is a reduction in the lateral extent of n+-doped terminal region 210 and first inorganic layer 402 as a result of the oxidation and oxide removal.

In region C of FIG. 6, the finforming process is complete. The material of first inorganic layer 402, for example the silicon nitride layer, has been completely or almost completely consumed. However, first inorganic layer 402 has protected the semiconductor material from oxidation and the removal of oxide in the vicinity of terminal region 210 and in particular n+-doped terminal region 210. Thus, from the point of view of shape, semiconductor fins 208 have a pillar-like structure (with capital, or concave side walls). By comparison with the conventional needle-shaped semiconductor fin with no first inorganic layer 402 (illustrated in region SdT in FIG. 6), a terminal region 210 formed in this way has a contact surface for a subsequently deposited source electrode that is larger and of laterally significantly greater extent.

Figure 7:
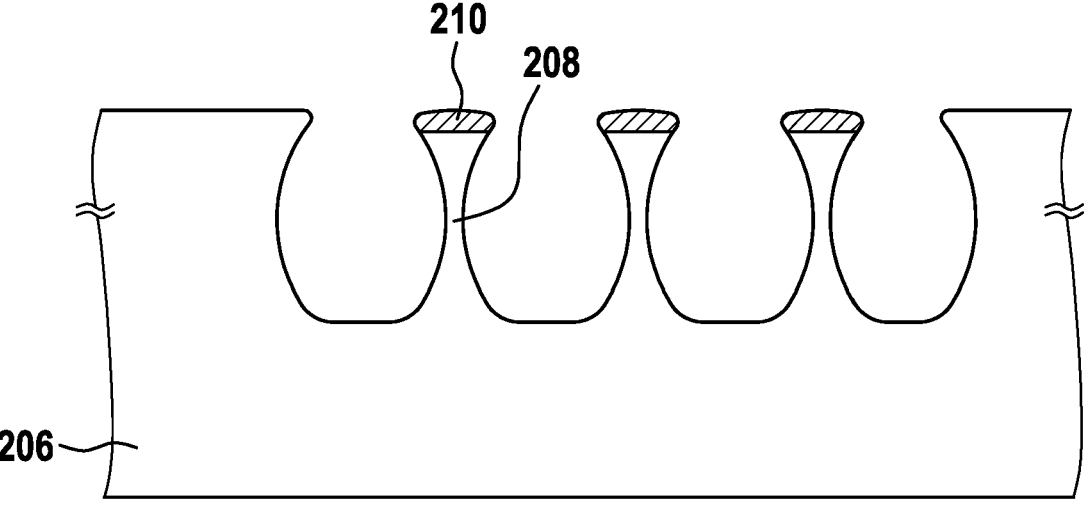

In a subsequent process step, any residue of first inorganic layer 402 can be completely removed, as illustrated in FIG. 7. This may be performed by a selective dry or wet etching process (not illustrated). The further method steps for forming the vertical field-effect transistor may correspond substantially to conventional method steps.

Figure 8:
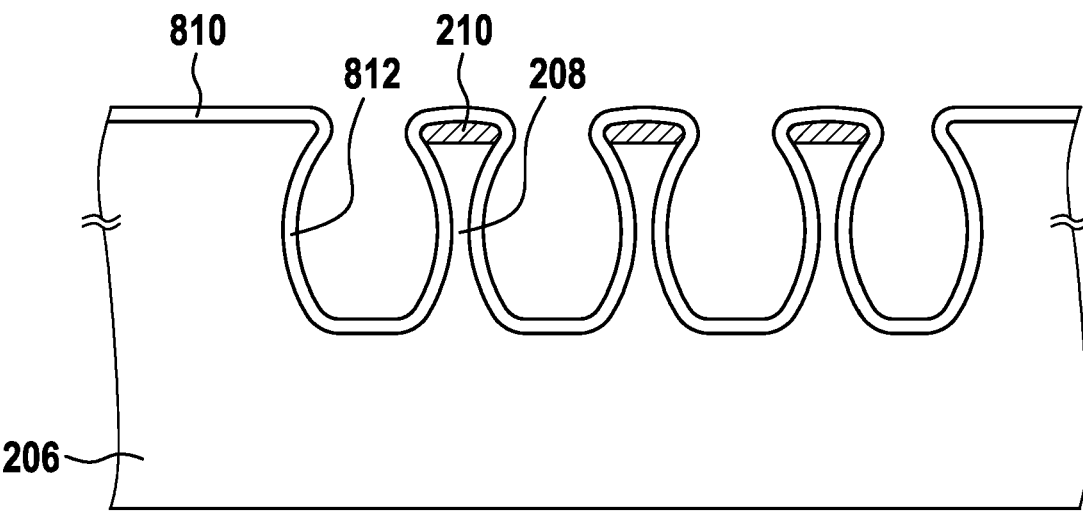

For example, a gate dielectric 810, for example a gate oxide, may be produced by oxidation or form-fitting deposition on the previously exposed surface. Gate dielectric 810 may cover both channel region 812 and also all the other surfaces, as illustrated in FIG. 8.

Figure 9:
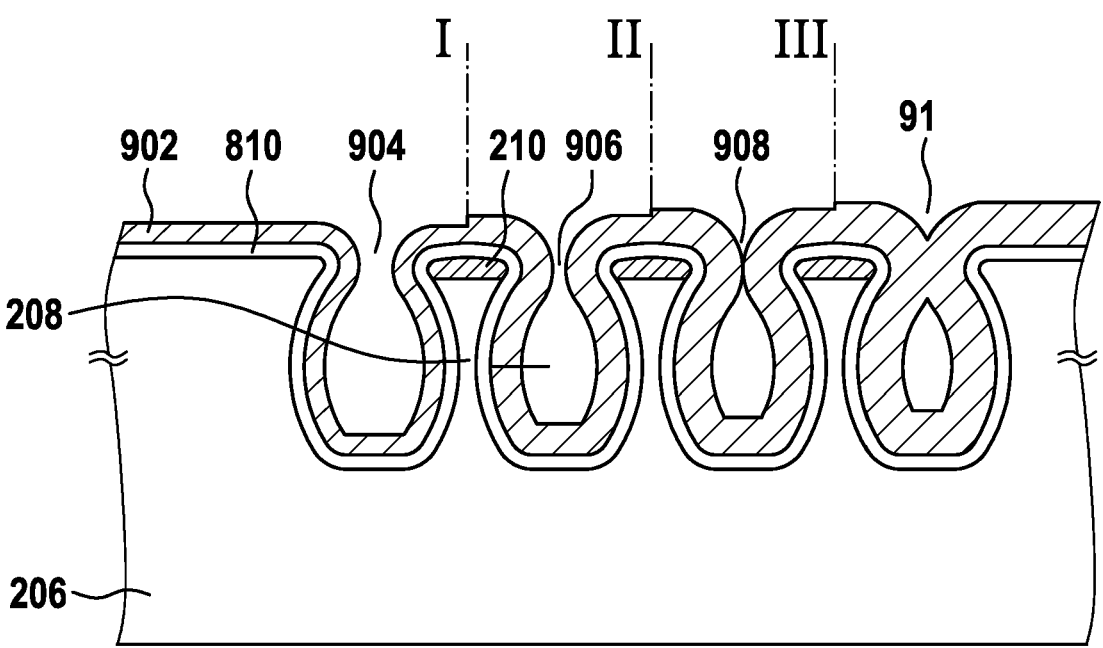
Figure 10:
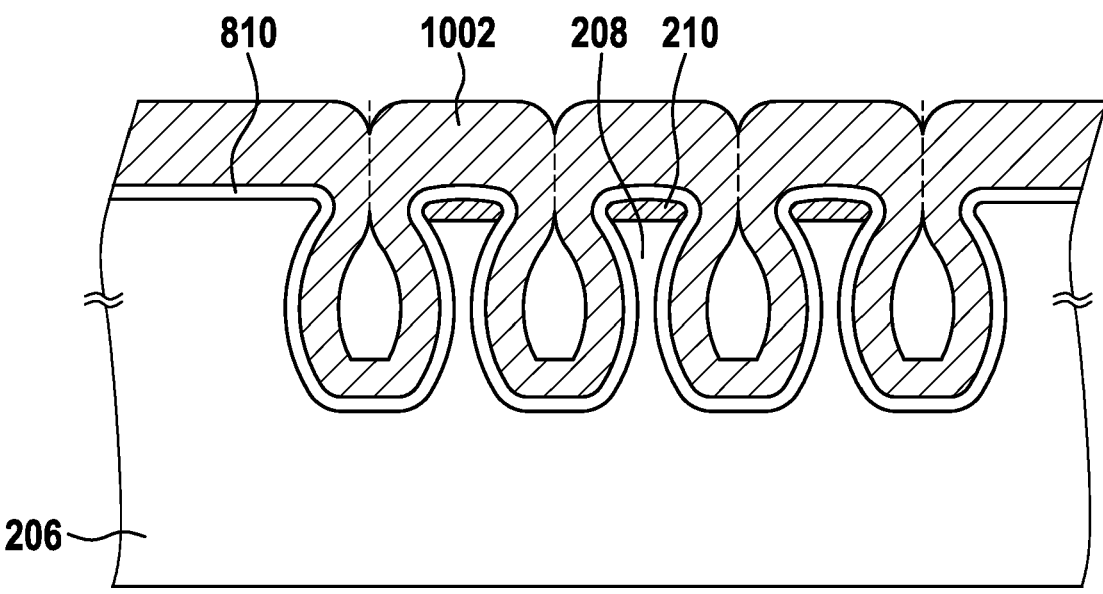

FIG. 9 shows a sectional view after the subsequent deposition of a polysilicon 902 for the purpose of forming the gate electrode, in a successively progressing formation from region I to region II and then region III. With a chemical vapor deposition at low pressure (LPCVD deposition) with in-situ doping, gate polysilicon 902 may also be deposited largely homogeneously and form-fittingly on gate dielectric 810 in the trench structure (502 in FIG. 5), or in cavity 904 between adjacent semiconductor fins 208 (also designated a "bulbous barrel region"). Because polysilicon is very good at accessing gaps, taking region I as a starting point, access opening 904 is closed up as deposition progresses through region II (906), with the result that in region III, in which access is closed 908, it is no longer possible for further polysilicon to be deposited in barrel region 904 from the surface. Further deposition results in opening 91 being completely closed off, and desired thickening and smoothing of the surface of deposited polysilicon 902. The profile of polysilicon 902 above all the "barrels" 904 once deposition of the polysilicon is at an end is illustrated in FIG. 10.

In various embodiments, cavity 904 (barrel), which is surrounded by two adjacent semiconductor fins 208, may be used in each case as a cooling structure, or may be configured thus, for example as a so-called heat pipe, for example for free, pneumatic convection or for forced convection.

Gate polysilicon layer 1002 may be formed homogeneously, over the entire gate dielectric region 810, and may form a homogeneous planar or smoothing layer on the exposed surface.

Figure 11:
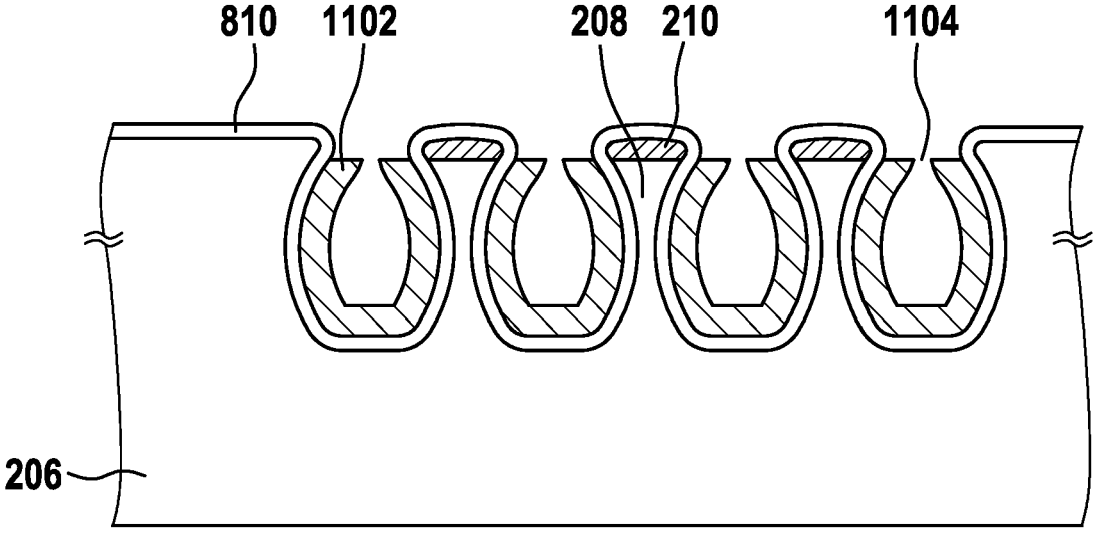

In a subsequent process, the result of which is illustrated in FIG. 11, gate polysilicon 1002 may be removed, for example in a dry structuring step, in the region in which the source contact is to be formed. Barrel regions 904 (see FIG. 9) and channel region 812, or the gate dielectric on channel region 812 (see FIG. 8), may remain completely covered by the remaining polysilicon 1102. For example, it is possible in a previous lithographic step (not illustrated) for raised regions of the exposed polysilicon layer 1002 also to be retained.

Figure 12:
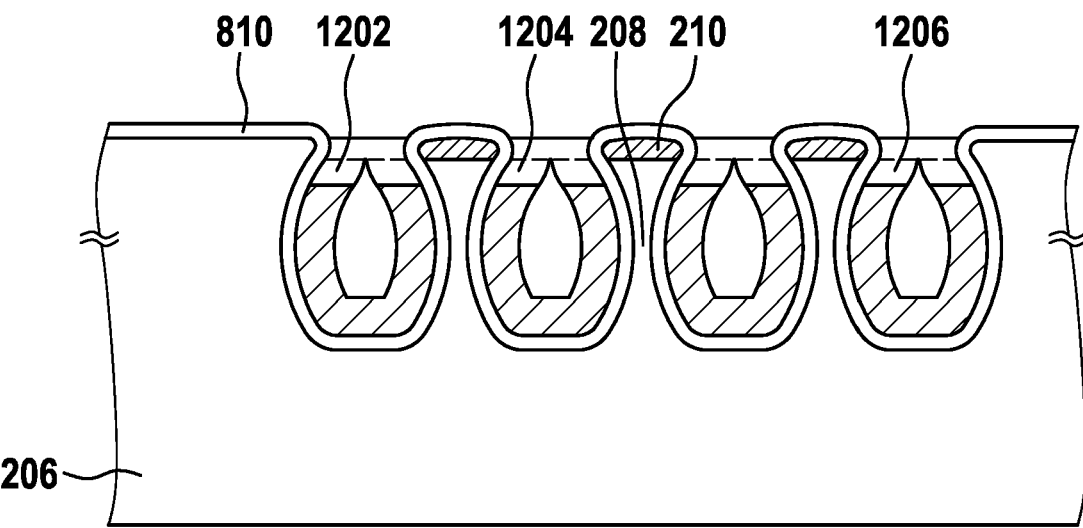

In a subsequent process, the result of which is illustrated in FIG. 12, it is possible for the surface of the structured polysilicon layer 1102 to be oxidized in a thin layer, for example by thermal oxidation. An oxide layer 1202 that is formed with a thickness in a range of from approximately 50 nm to approximately 150 nm may be sufficiently thin. The surface of structured polysilicon layer 1102 (see FIG. 11) before the oxidation is illustrated by dashed line 1204. As a result of the oxidation and its increase in volume, it is also optionally possible to close off again openings that have been newly produced by structuring of the polysilicon 1002 (see opening 1104 on the right in FIG. 11, giving opening 1206 in FIG. 12).

Figure 13:
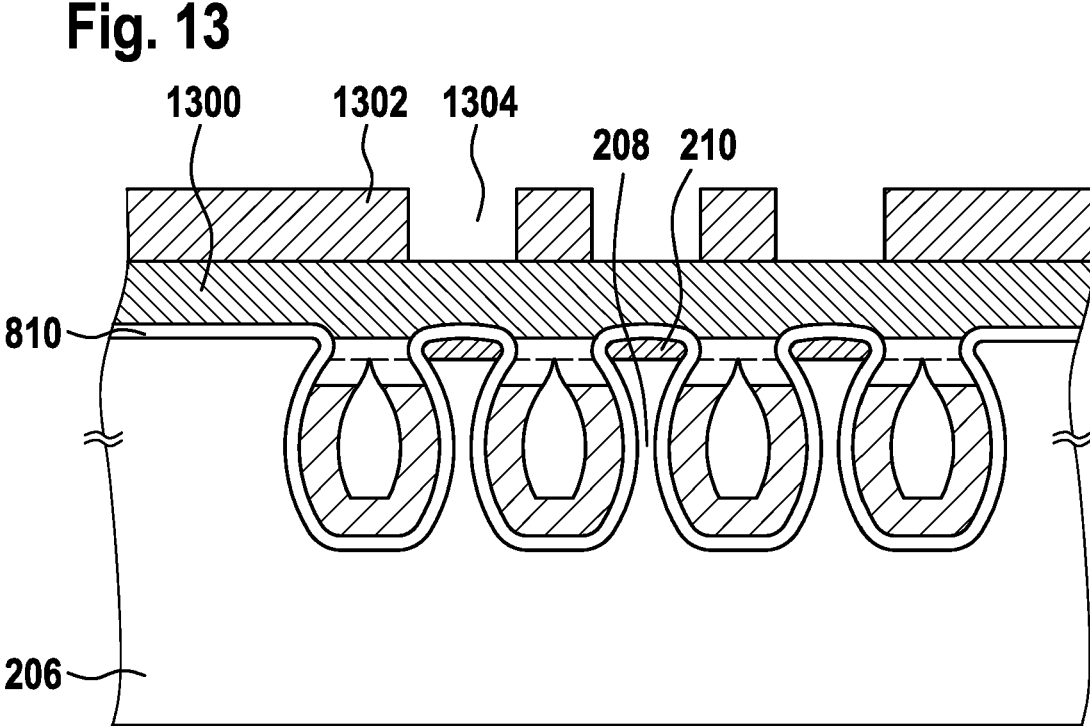

In a subsequent process, the result of which is illustrated in FIG. 13, a covering semiconductor oxide layer 1300 may be deposited in a planar layer, for example by LPCVD. FIG. 13 shows the deposited semiconductor oxide layer 1300, already with a photoresist layer 1302, which with the aid of lithography provides the structuring 1304 for the semiconductor oxide layer 1300 for the corresponding source contacts (see FIG. 14).

FIG. 14 shows the structured semiconductor oxide layer 1404, the contact regions 1402 that are opened up toward the n+ terminal regions 210. Furthermore, FIG. 14 shows the deposited contact metal, which forms an ohmic contact (source electrode 218) in the regions of opened-up semiconductor oxide layer 1404 having the respective n+ terminal region 210. The contact metal, or optionally also a suitable semiconductor material, has a significantly larger surface contact than the conventionally rounded semiconductor fins, and thus spans a source contact surface of large extent.

As an alternative to forming the concave side wall of the semiconductor fin by oxidation, isotropic dry or wet etching processes may be used similarly. For example, in the case of semiconductor materials on which it is not possible to form a thermal oxide, such as gallium nitride (GaN), gallium oxide (GaOx), aluminum nitride (AlN), diamond, an isotropic etching process may provide the possibility of achieving the shape of semiconductor fins that is shown in FIG. 7. Analogously to the variant of thermal oxidation, the masking of the semiconductor fins may be selected such that it has a resistance to the subsequent isotropic etching. When a suitable isotropic etching is applied, the achievable profiles of the semiconductor fins are of a comparable shape to the profiles of the semiconductor fins that are produced by oxidation. For gallium nitride, gallium oxide and aluminum nitride, dry etching in a plasma containing chlorine may be used, for example. For diamond, a comparable etching in a plasma containing oxygen may be used. Wet-chemical etching processes for gallium nitride are possible, for example, in potassium hydroxide (KOH) or tetramethylammonium hydride (TMAH) of different concentrations and temperatures. Masking materials that may be used are nitride and/or oxide compounds.

Figure 15:
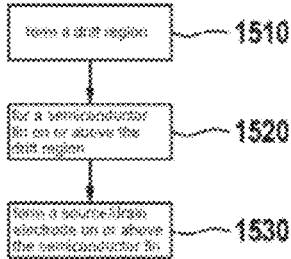
FIG. 15 shows a flow diagram of a method for forming a vertical field-effect transistor according to various example embodiments of the present invention.

FIG. 15 shows a flow diagram of a method 1500 for forming a vertical field-effect transistor according to various embodiments. The method 1500 includes: forming 1510 a drift region, forming 1520 a semiconductor fin on or above the drift region, and forming 1530 a source/drain electrode on or above the semiconductor fin, the semiconductor fin being formed with at least one concave side wall in the region between the drift region and the source/drain electrode. This enables safe and reliable process control when forming the front-side contact of the vertical field-effect transistor. With the aid of the method, moreover a planar surface for subsequent processes may be achievable. Planar surfaces allow thinner layer thicknesses to be achieved in the layers deposited on them. This enables the use of shorter and economically more favorable deposition processes. With an appropriately selected process control, dugout cooling channels between adjacent semiconductor fins, for free convection or forced convection, may be used for cooling. In order to manufacture the vertical field-effect transistors, it is possible, as regards investment and operating costs, to make use of plant equipment that is lower in cost than other concepts.

The at least one concave side wall of the semiconductor fin may be formed using an etch-stop mask, the etch-stop mask being formed on or above the semiconductor fin. The etch-stop mask may include a nitride compound. The at least one concave side wall of the semiconductor fin may be formed by oxidation of a semiconductor material of the semiconductor fin and removal of the formed oxide semiconductor material. The formation of the at least one concave side wall of the semiconductor fin may include repeated carrying out of oxidation of a semiconductor material of the semiconductor fin and of subsequent removal of the formed oxide semiconductor material. As an alternative, it is possible to form the at least one concave side wall of the semiconductor fin with the aid of isotropic etching of a semiconductor material of the semiconductor fin.

A highly doped terminal region may electrically conductively connect the semiconductor fin to the source electrode.

The source electrode may additionally be formed laterally next to at least one side wall of the semiconductor fin, on or above the drift region.

The embodiments that are described and shown in the figures are selected only for the purpose of example. Different embodiments may be combined with one another in their entirety or in respect of individual features. It is also possible for an embodiment to be supplemented by features of a further embodiment. Furthermore, described method steps may be carried out repeatedly and in an order other than that described. In particular, the present invention is not restricted to the method indicated.

What is claimed is:

1. A vertical field-effect transistor, comprising:
   a drift region;
   a semiconductor fin on or above the drift region;
   a source/drain electrode on or above the semiconductor fin, the semiconductor fin including at least one concave side wall in a region between the drift region and the source/drain electrode,
   a gate electrode formed laterally next to at least one side wall of the semiconductor fin,
   the at least one concave side wall being formed in that the semiconductor fin has a smaller lateral extent in a first portion, which is arranged laterally next to the gate electrode, than in a second portion, which makes contact with the drift region, and/or than in a third portion, which makes contact with the source/drain electrode,
   wherein the at least one concave side wall faces laterally toward the gate electrode and defines a reduced lateral width of the semiconductor fin at a central portion located between upper and lower portions of the semiconductor fin, such that the semiconductor fin is narrower in the central portion than both the upper portion adjacent to the source/drain electrode and the lower portion adjacent to the drift region.

2. The vertical field-effect transistor as recited in claim 1, wherein the drift region and the semiconductor fin are formed from silicon carbide or gallium nitride.

3. The vertical field-effect transistor as recited in claim 1, wherein the semiconductor fin includes a first side wall and a second side wall, which is on an opposite side to the first side wall, the first side wall and the second side wall being concave in form.

4. The vertical field-effect transistor as recited in claim 1, wherein the at least one concave side wall is defined by the reduced lateral width at the central portion of the semiconductor fin relative to upper and lower portions of the semiconductor fin, the reduced lateral width being formed by oxidation and removal of semiconductor material at sidewalls of the fin, and the upper portion of the semiconductor fin being protected from oxidation by an etch-stop mask formed on or above the semiconductor fin.

5. A method for forming a vertical field-effect transistor, the method comprising:
   forming a drift region;
   forming a semiconductor fin on or above the drift region; and
   forming a source/drain electrode on or above the semiconductor fin, the semiconductor fin being formed with at least one concave side wall in a region between the drift region and the source/drain electrode,
   wherein a gate electrode is formed laterally next to at least one side wall of the semiconductor fin, the at least one concave side wall being formed in that the semiconductor fin has a smaller lateral extent in a first portion, which is arranged laterally next to the gate electrode, than in a second portion, which makes contact with the drift region, and/or than in a third portion, which makes contact with the source/drain electrode, wherein the at least one concave side wall faces laterally toward the gate electrode and defines a reduced lateral width of the semiconductor fin at a central portion located between upper and lower portions of the semiconductor fin, such that the semiconductor fin is narrower in the central portion than both the upper portion adjacent to the source/drain electrode and the lower portion adjacent to the drift region.

6. The method as recited in claim 5, wherein the at least one concave side wall of the semiconductor fin is formed using an etch-stop mask, the etch-stop masking formed on or above the semiconductor fin.

7. The method as recited in claim 6, wherein the etch-stop mask includes a nitride compound.

8. The method as recited in claim 5, wherein the at least one concave side wall of the semiconductor fin is formed by oxidation of a semiconductor material of the semiconductor fin and removal of the formed oxide semiconductor material.

9. The method as recited in claim 8, wherein the formation of the at least one concave side wall of the semiconductor fin includes repeated carrying out of oxidation of a semiconductor material of the semiconductor fin and of subsequent removal of the formed oxide semiconductor material.

10. The method as recited in claim 5, wherein the concave side wall of the semiconductor fin is formed using isotropic etching of a semiconductor material of the semiconductor fin.

* * * * *